(12) United States Patent
Lee

(10) Patent No.: US 7,368,781 B2
(45) Date of Patent: May 6, 2008

(54) CONTACTLESS FLASH MEMORY ARRAY

(75) Inventor: Everett B. Lee, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/751,193

(22) Filed: Dec. 31, 2003

(65) Prior Publication Data
US 2005/0139935 A1    Jun. 30, 2005

(51) Int. Cl.
*H01L 29/788* (2006.01)
*H01L 21/82* (2006.01)

(52) U.S. Cl. .............. 257/317; 257/390; 257/E27.103; 365/185.33

(58) Field of Classification Search ........... 257/390, 257/315, 316, 314, 761, 764, 765, 767, 589, 257/391, 388, 317, E27.103; 365/185.33
See application file for complete search history.

(56) References Cited

U.S. PATENT DOCUMENTS

| 5,091,326 A | * | 2/1992 | Haskell | ................ 438/257 |
| 5,734,607 A | * | 3/1998 | Sung et al. | ............ 365/185.01 |
| 6,107,670 A | | 8/2000 | Masuda et al. | |
| 6,197,639 B1 | * | 3/2001 | Lee et al. | ................ 438/258 |
| 6,495,467 B2 | * | 12/2002 | Shin et al. | ................ 438/706 |
| 6,765,258 B1 | * | 7/2004 | Wu | ............. 257/315 |
| 2002/0038911 A1 | * | 4/2002 | Graas et al. | ................ 257/763 |

FOREIGN PATENT DOCUMENTS

| JP | 5-259476 | 1/1994 |
| WO | WO 97/11411 A | 3/1997 |

OTHER PUBLICATIONS

Kim, J., et al., "A Novel 4.6F2 NOR Cell Technology With Lightly Doped Sourd (LDS) Junction For High Density Flash Memories," IEEE, 1998, 4 pages.
Memory Division, Samsung Electronics Co., LTD.
Pavan, P., et al.,"Flash Memory Cells-An Overview," IEEE, 1997, vol. 85, No. 8, Aug. 1997, pp. 1248-1271.
PCT/US2004/043731 International Search Report.

* cited by examiner

*Primary Examiner*—Thomas Dickey
*Assistant Examiner*—Fazli Erdem
(74) *Attorney, Agent, or Firm*—Blakely, Sokoloff, Taylor & Zafman LLP

(57) ABSTRACT

A method for forming a contactless flash memory cell array is disclosed. According to an embodiment of the invention, a plurality of active regions is formed on a substrate. An insulating layer is then deposited over the active regions, and a portion of the insulating layer is removed to form a one-dimensional slot and to provide access to the active regions. A bit line is then formed in the slot in contact with the active regions.

20 Claims, 17 Drawing Sheets

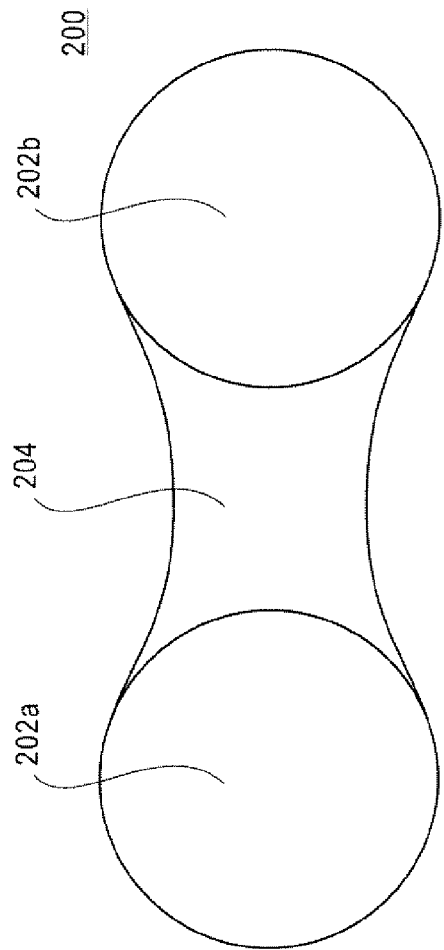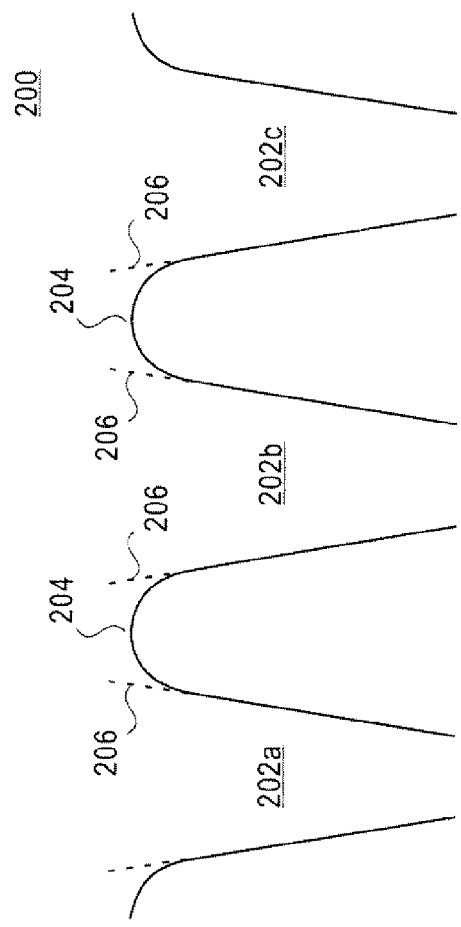
FIG. 2A (Prior Art)
FIG. 2B (Prior Art)

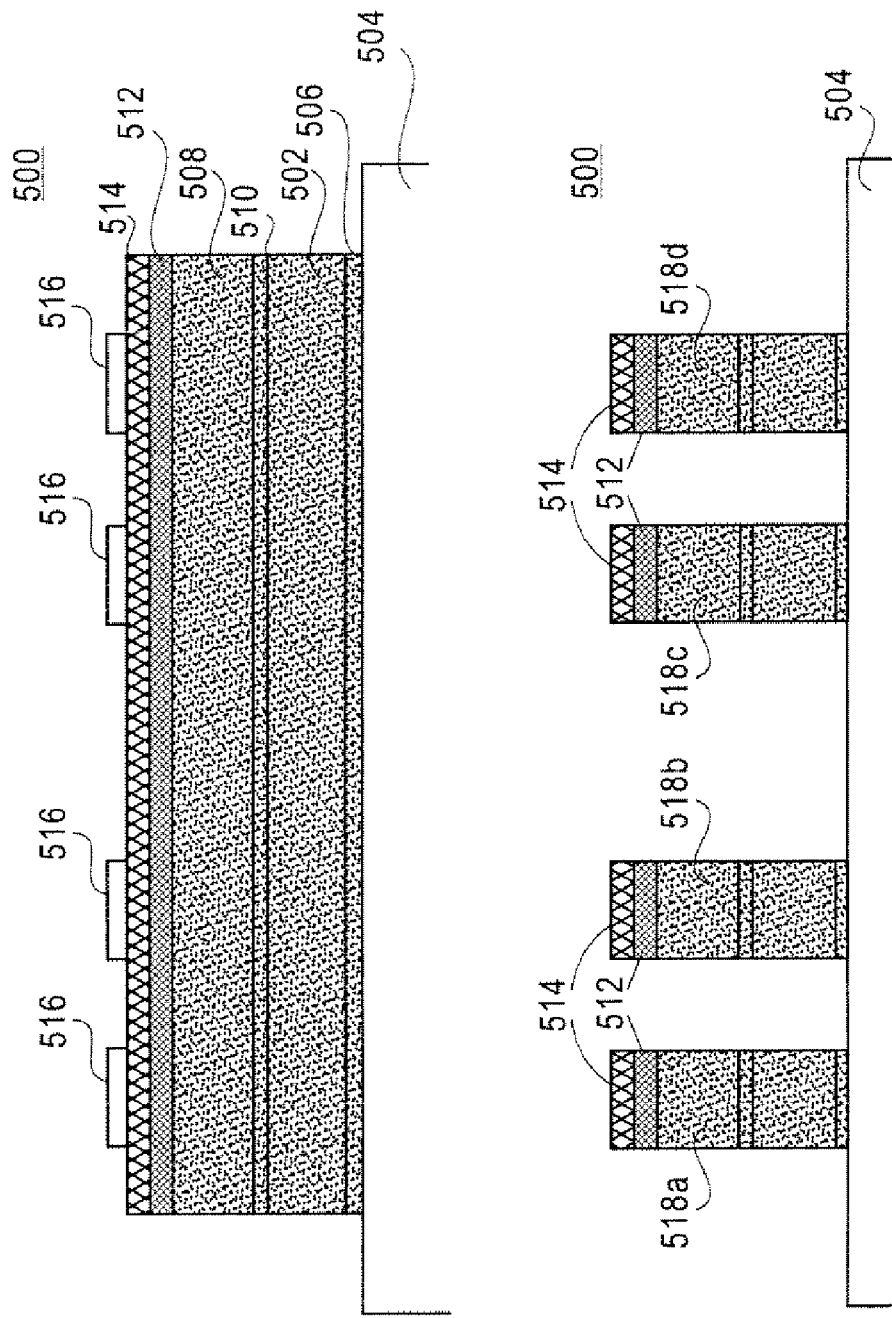

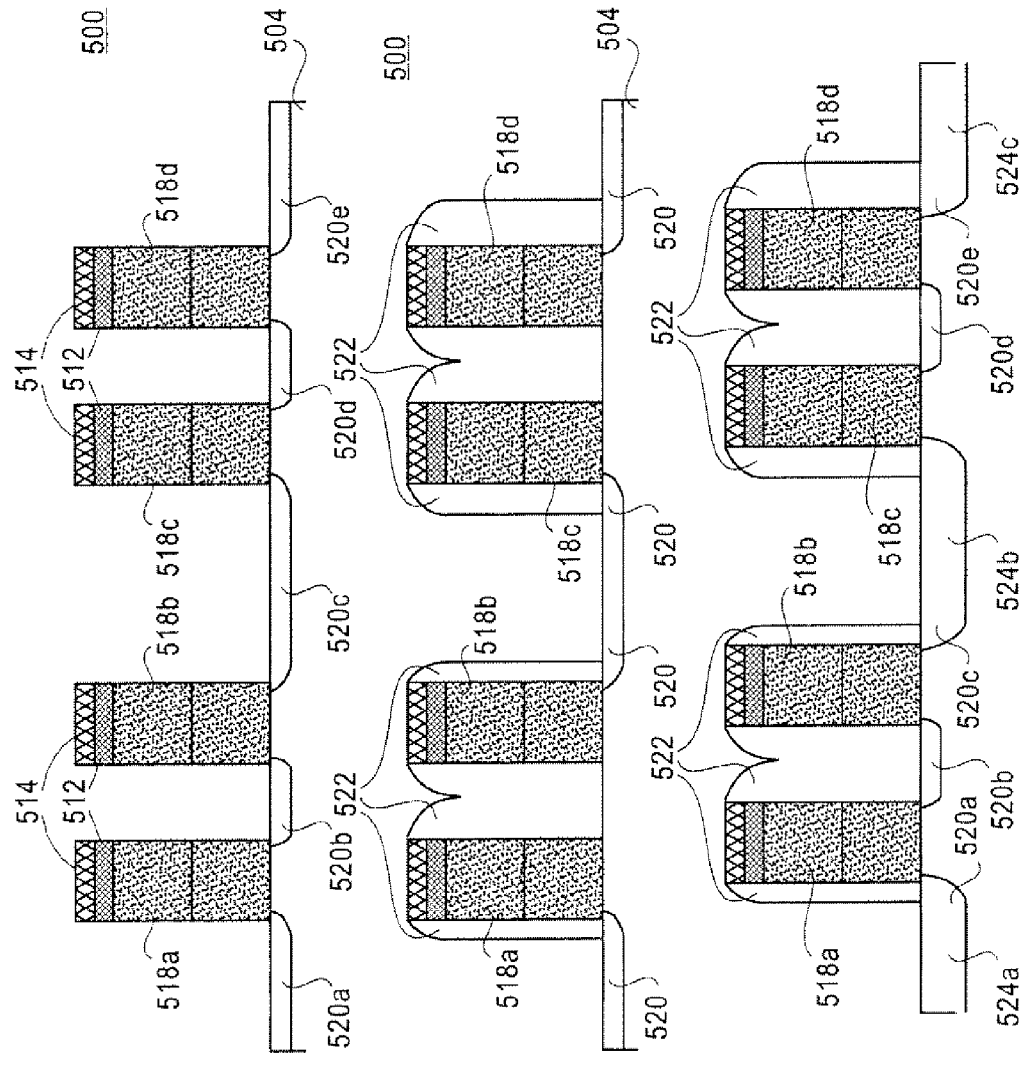

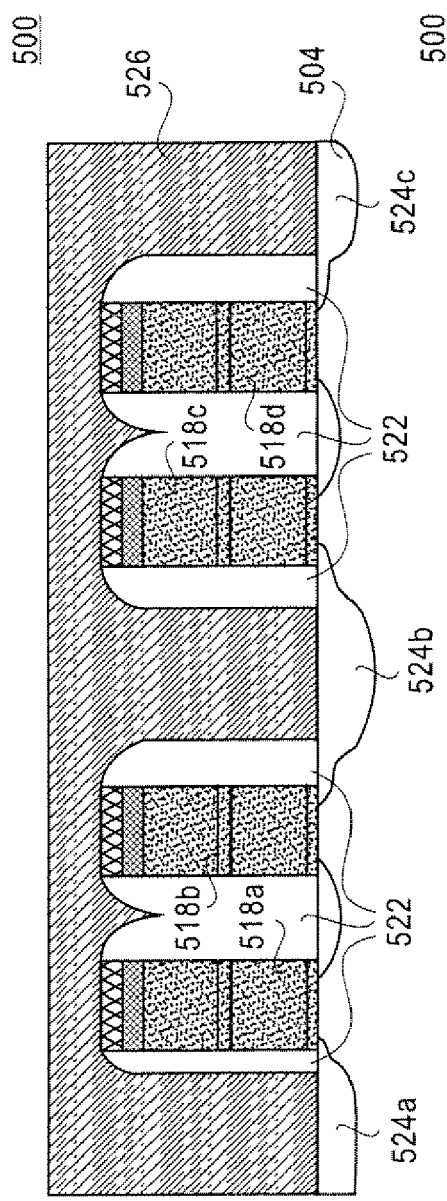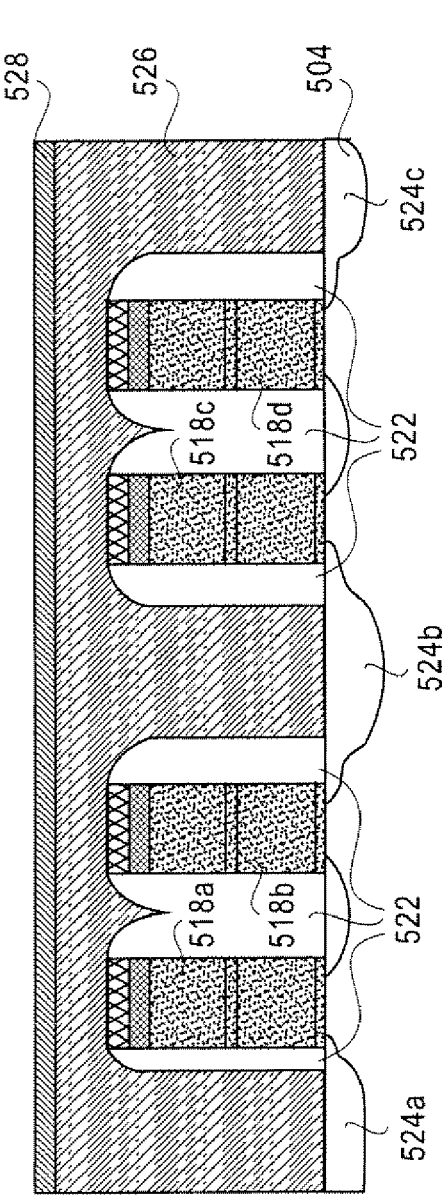
FIG. 5J
FIG. 5K

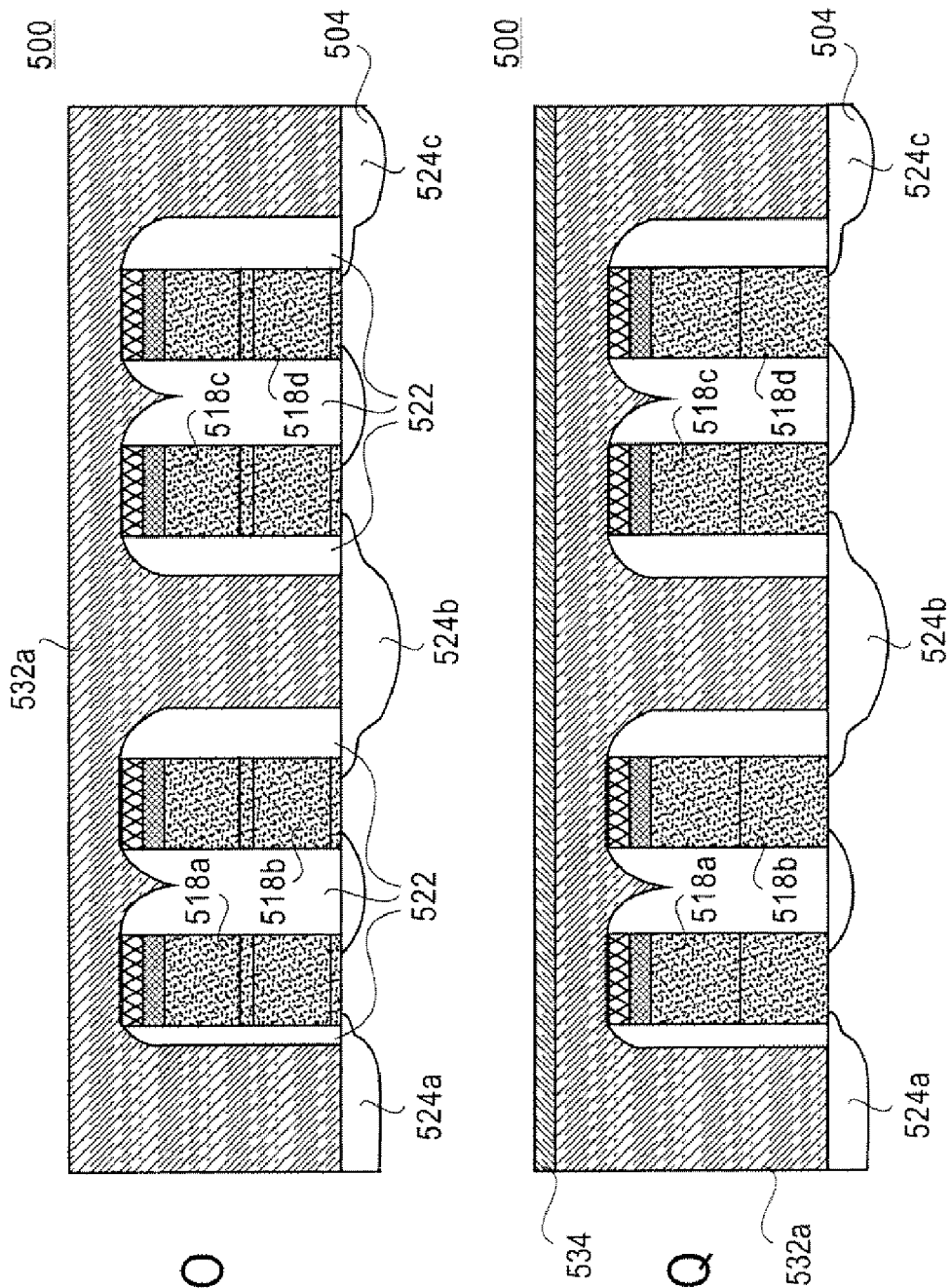

CONTACTLESS FLASH MEMORY ARRAY

FIELD OF THE INVENTION

The invention relates to semiconductor processing generally, and specifically to flash memory arrays.

BACKGROUND

Semiconductor devices, such as transistors, can be formed on silicon substrates. A transistor, for example, includes a source, a drain, and a gate formed in or on a silicon substrate. The source and drain may be formed by creating doped regions in the silicon, and the gate may be polysilicon deposited on the substrate. An insulating layer may be deposited over the substrate and the transistors formed in the substrate to insulate the active regions of the substrate. In order for the semiconductor device to function, electrical connections are made with the various components of the transistor. Portions of the insulating layer may be removed to provide access to the substrate and semiconductor devices below.

FIGS. 1A-C illustrate a prior art flash memory cell array 100. FIG. 1A illustrates an overhead view of a flash memory cell array 100. The array 100 shows a portion of a typical NOR flash memory cell array. The array 100 includes several drain contacts 102 and several source contacts 104. The contacts 102 and 104 may comprise a conductive material such as tungsten. The gates for the transistors are connected through word lines 106, and the drains for the transistors are connected through bit lines 108. In order to program or erase a specific cell, a signal is sent down the appropriate word line and bit line. For example, to program or erase the memory cell connected to the contact 102a, a pulse is sent through the bit line 108a and through the word line 106a, coupled through the common source rail via source contact 104a and source strap 108d.

FIG. 1B illustrates a cross-sectional view of the array 100. As can be seen in FIG. 1B, the word lines 106 connect the control gates required for the memory cell, and are located over the floating gates 110. There is an interpoly oxide layer such as an oxide/nitride/oxide (ONO) dielectric layer between the gates to provide isolation and a tunnel oxide between the substrate 112 and the floating gates 110. FIG. 1C illustrates another cross-sectional view of the array 100. The layer 108 is typically either an etched aluminum metal pattern or a copper-filled trench using a damascene process. The isolation trenches 114 run through the substrate 112 and separate the diffusion regions 116 in the substrate 112.

The contacts 102 and 104 may be formed using a self-aligned contact (SAC) process. This technique typically involves forming an insulating shield layer of silicon nitride ($Si_3N_4$) over and around the gates. Another insulator layer of silicon dioxide ($SiO_2$) is then deposited on the gate and substrate. A hole is then patterned and etched into the silicon dioxide layer, forming an SAC well that adjoins the silicon nitride barrier layer and exposes an area of the source or drain pocket. A contact material may then be deposited in the contact well to form an electrical contact to the source or drain pocket.

As can be seen in FIG. 1A, the contacts 102 and 104 are rectangular and the length and width of the openings are comparable in size. To form the openings required for the rectangular contacts, two-dimensional mask patterning must be used. However, accurately imaging two-dimensional patterns can be difficult as feature size is reduced. FIGS. 2A and 2B illustrate views of openings formed in an interlayer dielectric (ILD). FIG. 2A illustrates an overhead view of the ILD 200. FIG. 2B illustrates a cross sectional view of the ILD 200. Several openings 202 are formed in the ILD 200. The openings 202 provide access to semiconductor features on a substrate and will later be filled with a conductive material to create contacts. As can be seen, a recessed portion 204 between the openings 202 has inadvertently been created. The lines 206 illustrate the intended shape of the openings 202. Small feature size can lead to the inability to accurately image two dimensional masks.

BRIEF DESCRIPTION OF THE DRAWINGS

FIGS. 2A and 2B illustrate views of openings formed in an interlayer dielectric (ILD).

DETAILED DESCRIPTION

Described herein is a method and apparatus for a contactless flash memory array. In the following description, numerous specific details are set forth. However, it is understood that embodiments may be practiced without these specific details. For example, well-known equivalent materials may be substituted in place of those described herein, and similarly, well-known equivalent techniques may be substituted in place of the particular semiconductor processing techniques disclosed. In other instances, well-known structures and techniques have not been shown in detail in order not to obscure the understanding of this description.

According to an embodiment of the current invention, a flash memory cell array includes a contactless bit line structure. According to this embodiment, the prior art contacts and bit line are replaced by an integrated structure that is formed using a single process. A flash memory cell array is formed using a process similar to that used to form a self aligned contact (SAC) structure, however instead of forming two dimensional openings for individual contacts and later forming a bit line over the contacts, a one dimensional slot is formed, and a plug, such as suitably conducting film, is deposited in the slot. The "one-dimensional" slot has a length that is much greater than its width, and the width is, as a result, insignificant compared to the length. This way, the "contacts" and the bit line are formed together, and the opening in the interlayer dielectric (ILD) can be formed using one-dimensional imaging. One-dimensional imaging allows for smaller feature size than two-dimensional imaging, thereby facilitating tighter memory cell densities.

Figure 1A:
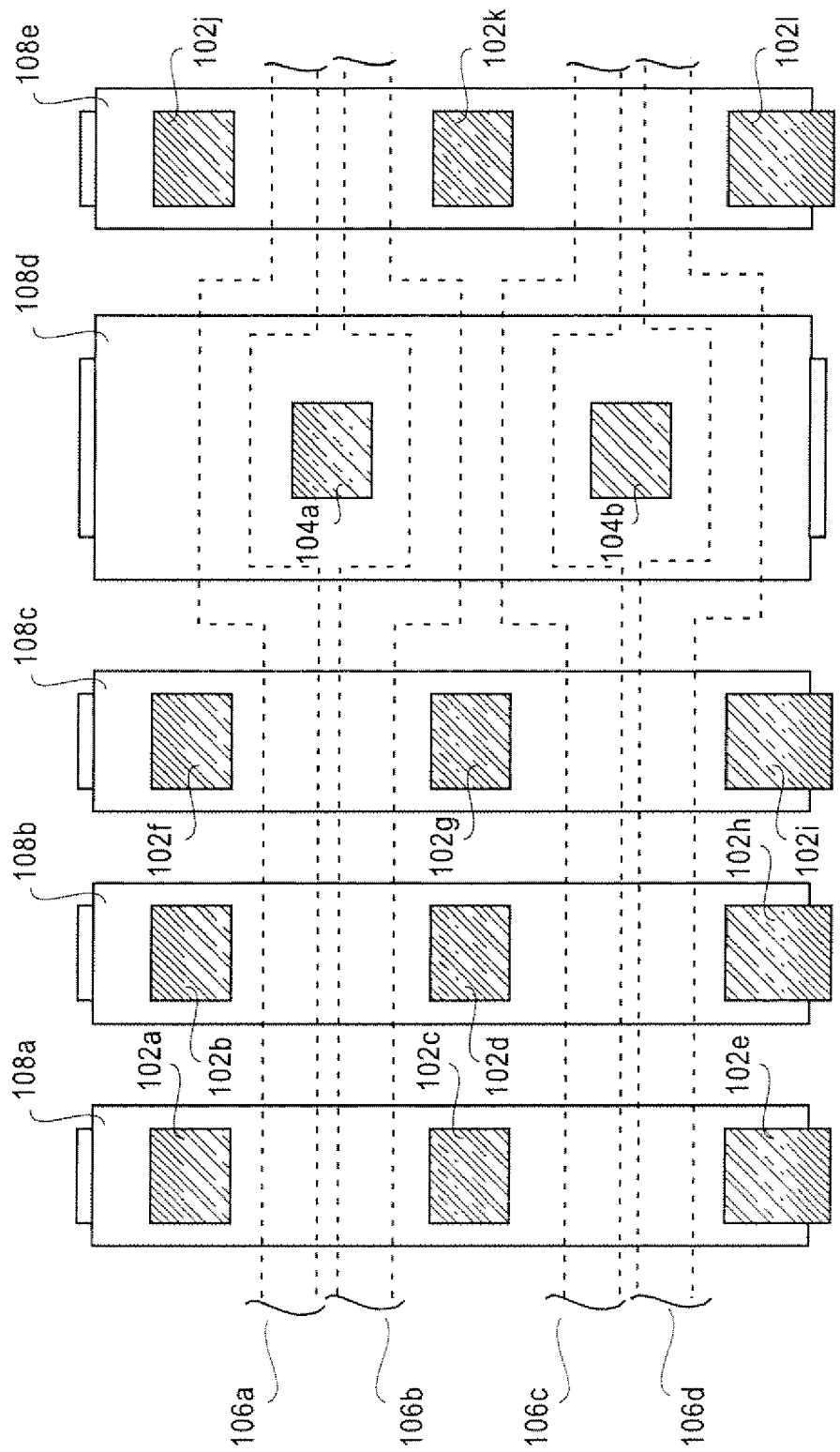
FIGS. 1A-C illustrate a prior art flash memory cell array.
Figures 1B, 1C:
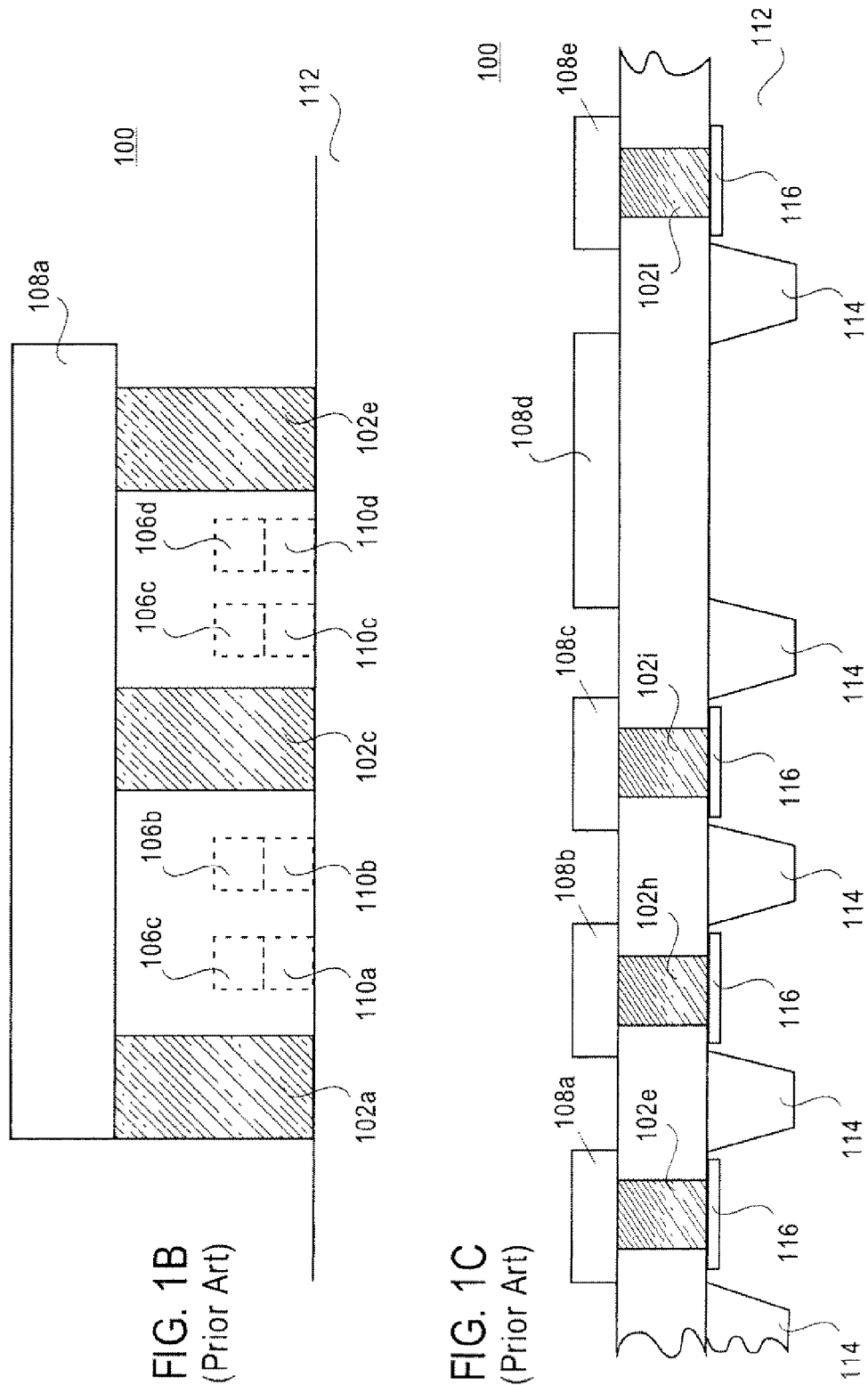
Figure 3A:
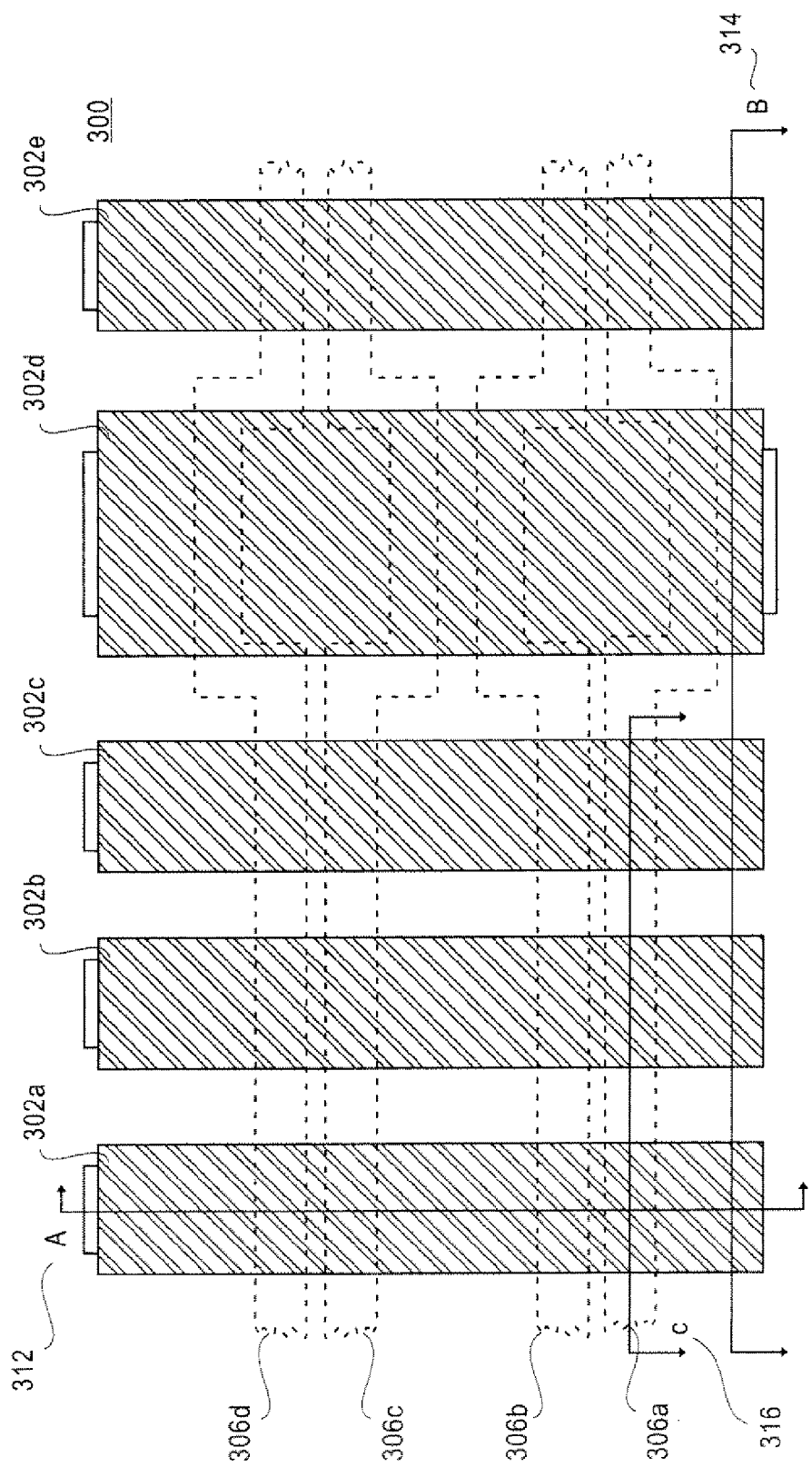
FIGS. 3A-C illustrate a contactless flash memory cell array according to an embodiment of the invention.
Figure 3B:
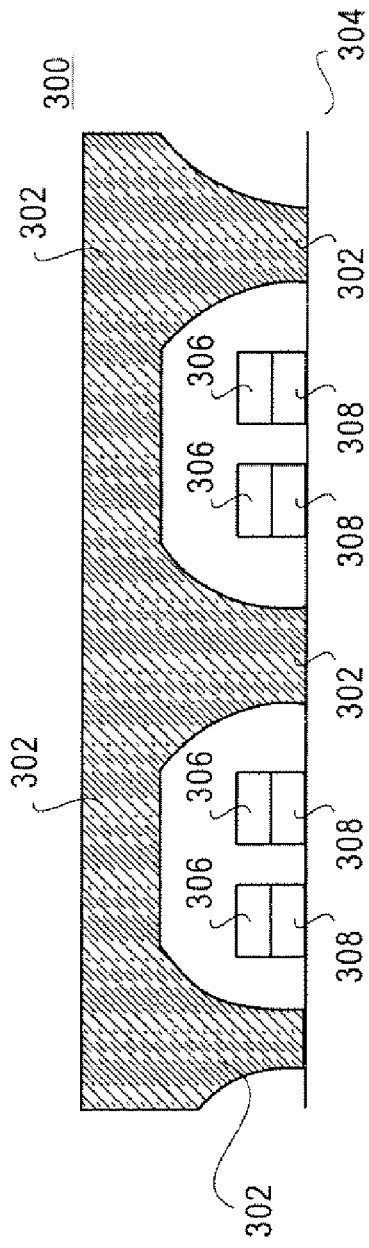
Figure 3C:
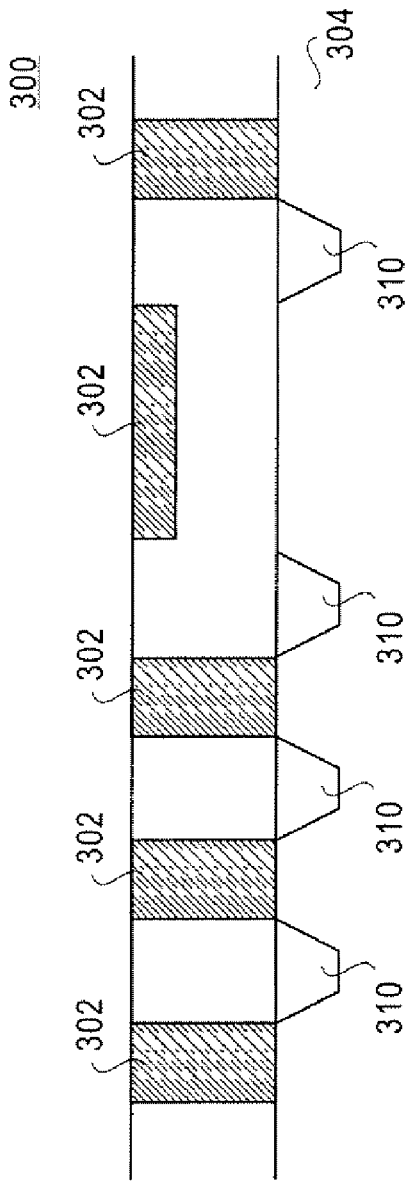

FIGS. 3A-C illustrate a contactless flash memory cell array according to an embodiment of the invention. FIG. 3A illustrates an overhead view of the cell array 300, and FIGS. 3B and 3C illustrate cross-sectional views of the cell array 300. FIG. 3B is a view along the line A 312 in FIG. 3A. FIG. 3C shows the view along the line B 314 in FIG. 3A. The bit lines 302 now contact the active regions of the substrate 304. Therefore, the bit lines 302 incorporate the function of the previously used contacts. Instead of having to form a bit line and several contacts individually, they can be formed together, reducing the number of process steps. Thus, since the bit line 302 incorporates the old contacts, the array 300 is "contactless." Since a bit line 302 can be formed in an opening that can be imaged as a slot, the feature size of the array 300 can be reduced, since one dimensional imaging allows for accurate imaging at smaller feature sizes. The control gates 306, the floating gates 308, and the isolation trenches are similar to prior flash memory cell arrays. The bit line 308d is a source strap that incorporates source contacts.

One dimensional imaging refers to using a photolithographic technique where a slot is formed in an insulating layer. The slot has a length much greater than its width. For example, the length may be 20-1000 or more times greater than the width of the slot. In this instance, the width of the slot would be insignificant for imaging purposes, and therefore, the pattern is one-dimensional. In one embodiment, the bit line 302 may have a width of 100 nm. The distance between two "cells" may be approximately 200 nm. Since a bit line may have 1000 or more cells, the length of the bit line may be several thousand times its width. At these dimensions, the opening for the bit line is essentially a one-dimensional line or slot, as compared to a two dimensional hole.

Figure 4:
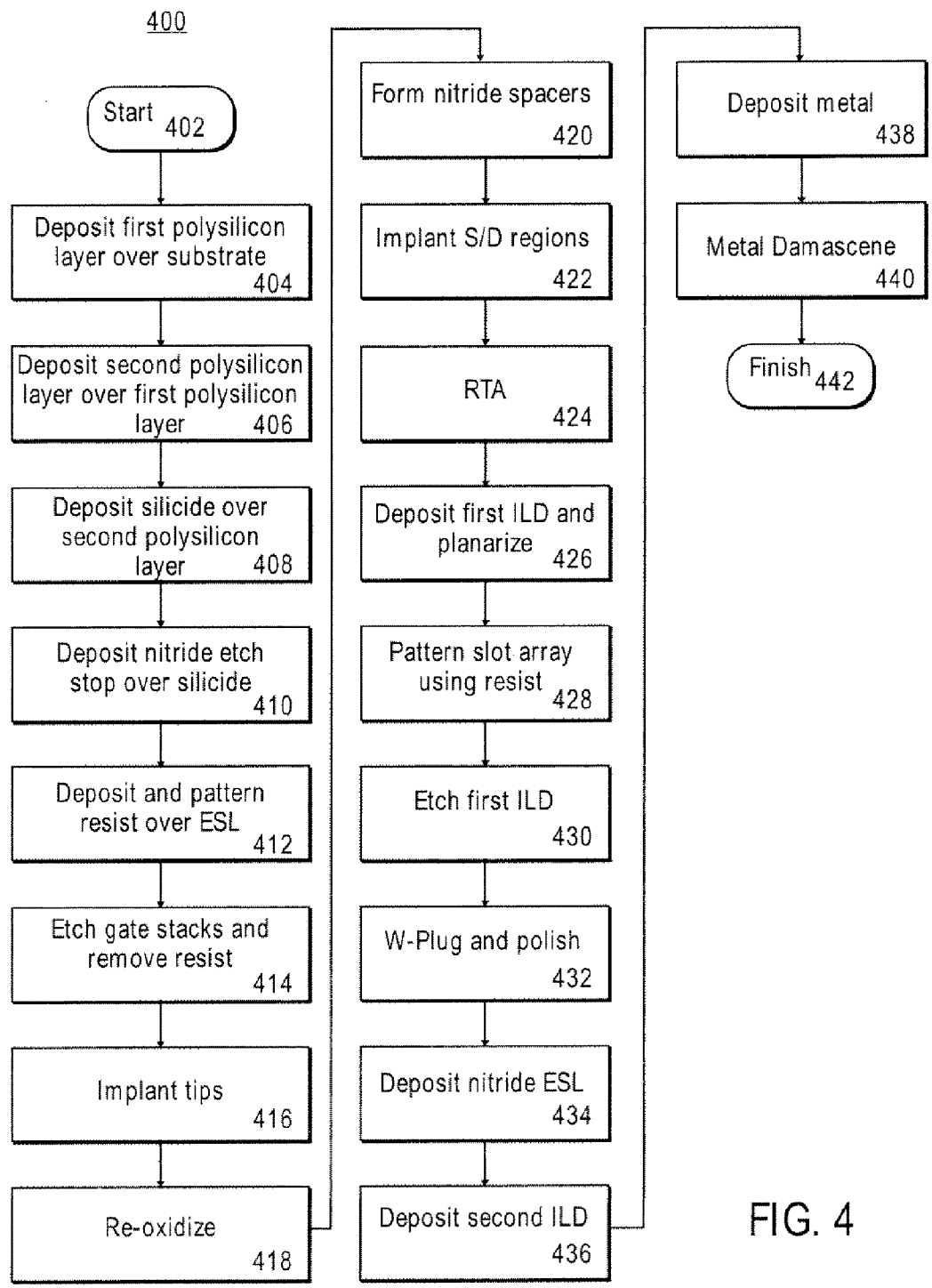
FIG. 4 illustrates an embodiment for forming a contactless cell array.
Figure 5A:
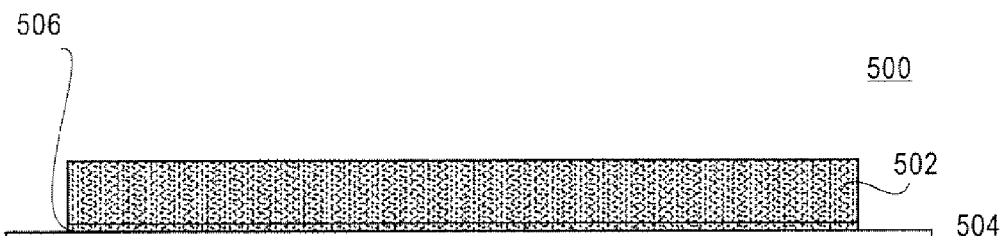
FIGS. 5A-5S illustrate the process described in FIG. 4.
Figure 5B:
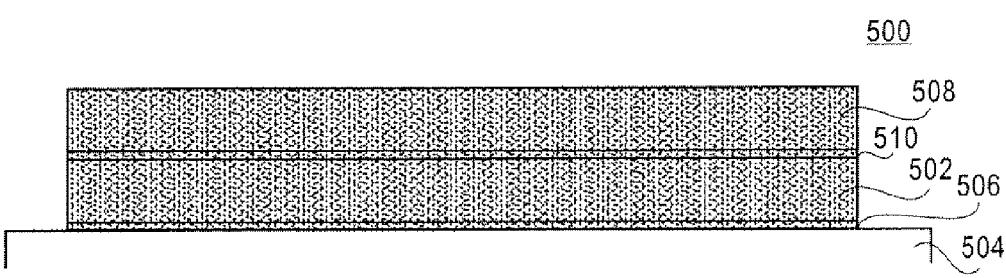
Figure 5C:
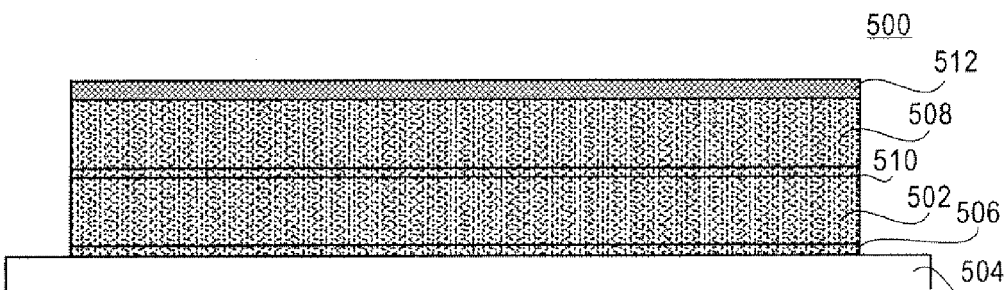
Figure 5D:
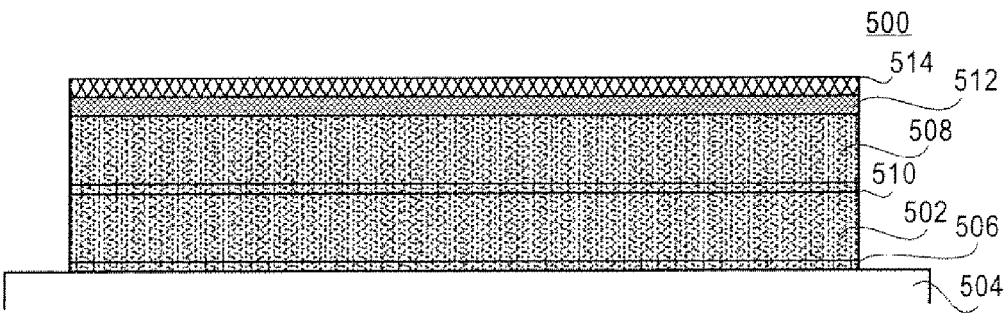
Figure 5L:
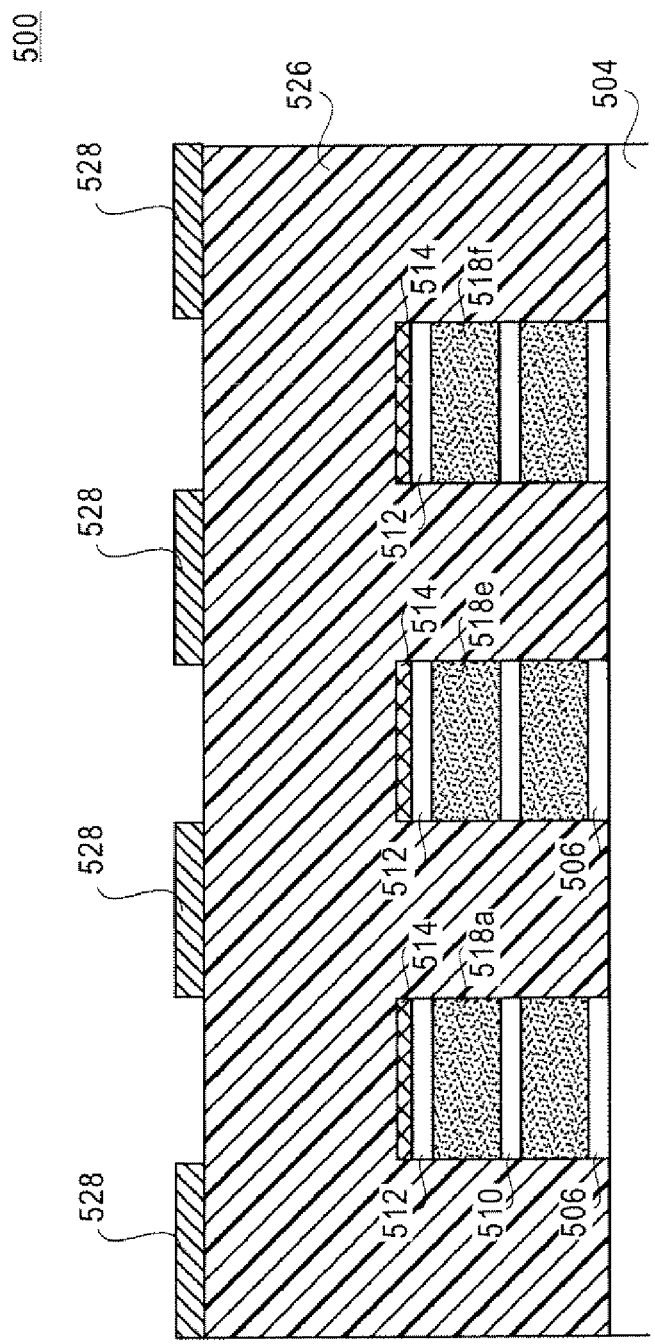
Figure 5M:
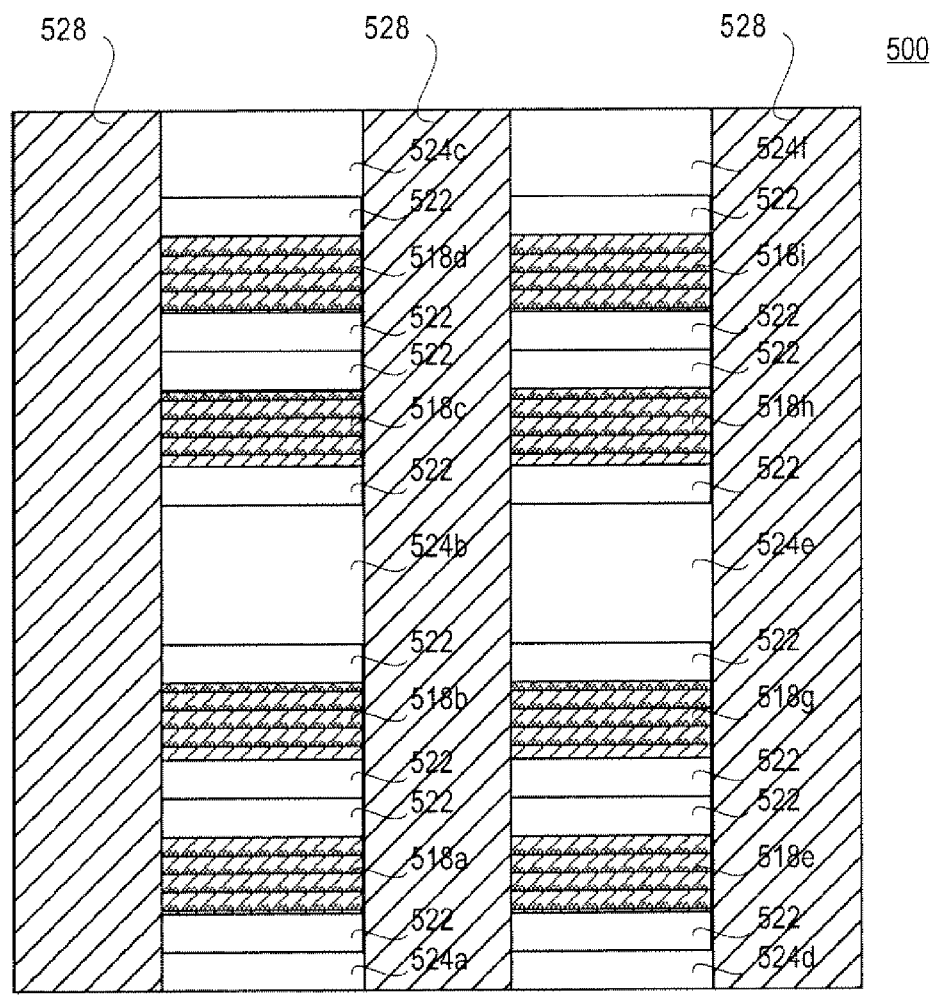
Figure 5N:
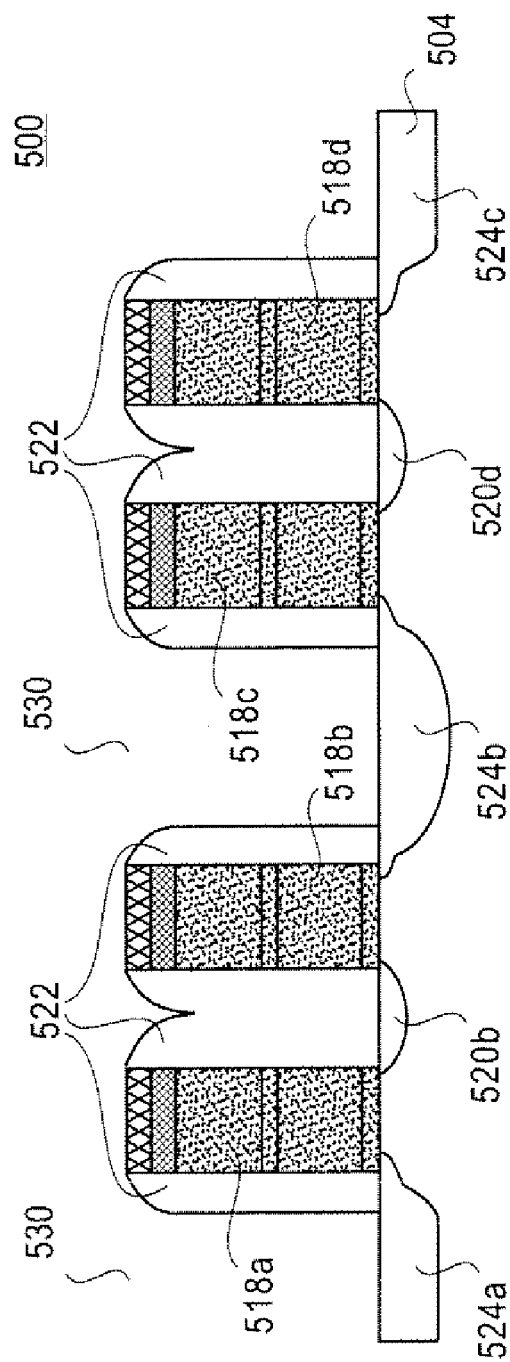

FIG. 4 illustrates an embodiment for forming a contactless cell array. FIGS. 5A-5S illustrate the process described in FIG. 4. Most of the FIGS. 5A-S use a perspective following the line A 312 in FIG. 3A. Exceptions will be noted where they occur. The process 400 begins in start block 402. In block 404, a first polysilicon layer 502 is deposited over a substrate 504. FIG. 5A illustrates a first polysilicon layer 502 deposited over a substrate 504. The bit line 302a makes contact with the drains that will be formed in the substrate 504. FIG. 5A shows a view following the to-be formed bit line 302a. The substrate 504 may be a single crystal silicon substrate appropriate for forming semiconductor devices. The polysilicon layer 502 is deposited over the substrate 504 using a chemical vapor deposition (CVD) or other appropriate process. A tunnel oxide 506 is disposed between the polysilicon layer 502 and the substrate 504. The tunnel oxide 506 may be a thermally deposited oxide having a thickness of approximately 10 nm. The polysilicon layer 502 may eventually form several floating gates for a flash memory cell array 500.

In block 406, a second polysilicon layer 508 is deposited over the first polysilicon layer 502. FIG. 5B illustrates a second polysilicon layer 508 deposited over a first polysilicon layer 502. There is an interpoly oxide layer 510 disposed in between the two polysilicon layers 502 and 508 to isolate the layers. The interpoly layer 510 may be an oxide/nitride/oxide (ONO) sandwich. The thickness of the interpoly layer 510 influences program and erase speed, a typical thickness is approximately 15 nm. The second polysilicon layer 508 may be used to form several control gates for a flash memory cell array 500.

In block 408, a silicide 512 is deposited over the second polysilicon layer 508. FIG. 5C illustrates a deposited silicide 512. The silicide 512 may be formed by depositing a layer of metal, such as cobalt, nickel, titanium, etc. over the polysilicon layer 508. The metal may be deposited using evaporation, sputtering, chemical vapor deposition (CVD), etc. The structure is then heated to a temperature between 600 and 1000° C., and the metal reacts with the polysilicon, forming the silicide 512. The silicide 512 is similar to those used in self-aligned contact (SAC) structures, in that it aligns to the top of a gate stack. The silicide 512 can be used to active the gate stacks, and form a word line.

In block 410, a nitride etch stop layer (NESL) is deposited over the silicide 512. FIG. 5D illustrates an NESL 514. The NESL 514 is used to protect the gate stacks when an ILD is later etched. A nitride/oxide/nitride sandwich layer may be deposited before the NESL 514 if necessary to raise the height of the nitride 514 above the gate stack.

In block 412, a resist layer 516 is deposited and patterned. FIG. 5E illustrates a patterned resist layer 516. The resist layer 516 may be deposited using a spin-on deposition, etc. The layer 516 is then exposed to ultraviolet (UV) light through a mask. If using a positive resist, the exposed resist can be developed and then removed, leaving only the resist which was masked off. This process is known as photolithography. The resist layer 516 defines the gate stacks.

After the resist layer is patterned, the gate stacks 518 are created in block 414. FIG. 5F illustrates several gate stacks 518. A plasma or other appropriate etch can be used to remove portions of the polysilicon layers 502 and 508 that are not beneath the resist layer 516. An etch can be selected that removes polysilicon at a much faster rate than resist. The remains of the polysilicon layers 502 and 508 form the gate stacks 518. Each gate stack 518 may typically have a feature width of 100-200 μm, although any appropriate size may be chosen. Each gate stack 518 comprises a control gate and a floating gate for an individual flash memory cell. As can be seen here, the control gates in each gate stack 518a-d are coupled to the word lines 306a-d in FIG. 3A respectively.

In block 416, tips 520a, c, and e are implanted in the substrate 504 to allow the gates 518 to be closer to the drain regions which will be formed later. FIG. 5G illustrates implanted tips 520. The tips 520 are implanted active regions that will form the source regions and extensions of the gate regions. The same process forms the source regions 520b and 520d that will be later covered by nitride spacers. Source contacts can be formed using techniques similar to those described herein, however the source contacts may be located in a different column along the source strap 302d. Conductivity ions of the desired type (p or n) are implanted in the desired regions using conventional semiconductor processes such as ion implantation to form the tips 520. The tips 520 will become extensions of drain regions, and are typically shallower than those regions. The tips 520 are implanted now to provide access to for the gate stacks 518 to the drain regions, which will be implanted after spacers are formed.

In block 418, the edges of the gate stacks 518 are oxidized in a process known as reoxidation or "re-ox." The reoxidation process forms reoxidized polysilicon sidewalls on the edge of the gate stacks 518. The reoxidation can be performed using a well-known thermal oxidation process.

In block 420, nitride spacers 522 are formed. FIG. 5H illustrates nitride spacers 522. The nitride spacers 522 will be used to align the bit line to the active regions of the substrate 504. The nitride spacers 522 can also protect the gate stacks 518 when an ILD deposited over the gate stacks 518 is etched. The nitride spacers 522 may be formed by depositing a silicon nitride layer over the array 500 and using an anisotropic etch to remove the portions of the layer not forming the spacers 522.

In block 422, drain regions are formed in the substrate 504. The drain regions 524 may be formed using conventional semiconductor processing operations such as ion implantation, etc. Other source regions may also be formed at this time elsewhere on the array 500. Ion implantation forms the drain regions 524 by implanting impurities, such as boron, into the substrate 504. FIG. 5I illustrates drain regions 524 formed in the substrate 504. The bit line will contact and communicate with the drain regions 524 after it is deposited. In one embodiment, for example, the regions 524a, 524b, and 524c are drain regions, while the previously formed narrow regions 520b and 520d between the gate stacks 518 are source regions. As a result, the source regions and drain regions 520b, 520d, and 524 are shared by more than one gate stack 518.

The source strap 302d, which is used to contact source regions in the substrate 504, may be formed in a contactless fashion similar to that described herein for the bit lines. Further, the several bit lines and source strap 308d may be formed at the same time.

In block 326, the array 500 is annealed using a rapid thermal annealing (RTA) process. The RTA process electrically activates the implanted impurities used to form the drain regions 524, as well as removing damage caused by the implantation. The RTA process uses high-intensity lamps to heat the substrate 504 to a desired temperature (e.g., 950-1050° C.) in a very short time. Other processes, such as rapid thermal oxidation (RTO) or rapid thermal nitridation (RTN) may also be used.

In block 426, a first interlayer dielectric (ILD) 526 is deposited over the array 500. FIG. 5J illustrates a deposited ILD 526. The first ILD 526 may be silicon dioxide ($SiO_2$) or another appropriate insulating layer such as dielectric layers having a low dielectric constant (low-K dielectric layers). The first ILD 526 may be deposited using a spin-on or other appropriate deposition process. After the first ILD 526 is deposited, it is planarized to create a smooth and level top surface. The ILD 526 can be planarized using a chemical mechanical polishing (CMP) process. The CMP process involves physically polishing the deposited ILD layer 526 while a chemical slurry is introduced onto the surface of the ILD 526. Planarization forms a smooth surface on which other layers can be deposited. Other methods of planarizing the ILD 526 may also be used.

In block 428, a layer of resist 528 is deposited over the array 400. FIGS. 5K, 5L, and 5M display the resist layer 528 from different angles. FIGS. 5K and 5L illustrate the patterned resist layer 528 using cross sectional views, while FIG. 5M illustrates the patterned resist layer using an overhead view. FIG. 5L shows a view along the line C 316 in FIG. 3A. As can be seen, the gate stacks 518a, 518e, and 518f align along separate bit lines 302a, 302b, and 302c respectively. The resist 528 may be deposited using photolithography as described above, and is patterned to protect the areas of the ILD 526 that are to remain, while exposing those that should be removed. The ILD 526 should be removed in the area above the gate stacks 518. As can be seen, the resist layer 528 has a slot pattern in it. A slot is a one-dimensional image, which can be printed much easier and smaller than a two-dimensional image. The slot pattern has a length along the bit line that is much greater than its width, which will be approximately the gate width. For example, the bit line may be 200 μm long while the gate is 100 nm wide, so the slot would be 200,000 times longer than it is wide.

The slot pattern has a length along the bit line that is much greater than its width, which makes it effectively one dimensional. As feature size is reduced, it is more difficult to image the two-dimensional square contacts that are currently in use. The one-dimensional slot used here allows for smaller feature size as well as reducing the number of steps required for processing, since the bit line is formed together with the "contacts." As mentioned above, the slot pattern involves patterning a very long slot, which is essentially one dimensional, since the length is much greater than the width. A combined contact/bit-line is formed using a single process.

In another embodiment, two-dimensional patterning may be used for other contacts if necessary or desired.

As can be seen in FIG. 5L, the ILD 526 may thick enough above the gate stacks 518 so that there is sufficient space to form a bit line to carry the required current. The ILD 526 immediately above the gate stacks 518 will be removed to accommodate the bit lines. FIG. 5M illustrates an overhead view of the array 500, similar to a portion of the array 300 shown in FIG. 3A. As shown here, the gate stacks 518a-d are along the bit line 302a, and the gate stacks 518e and 518g-t are along the bit line 302b. As can be seen, the resist 528 is removed above the gate stacks 518. It is understood that FIG. 5M illustrates only a small portion of an entire memory array, and that there may be hundreds, thousands, or any desired number of gate stacks under each bit line.

Figure 6A:
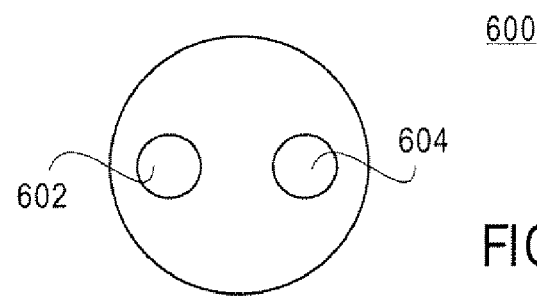
FIGS. 6A-C illustrate imaging a resist layer using an off-axis illumination scheme.
Figure 6B:
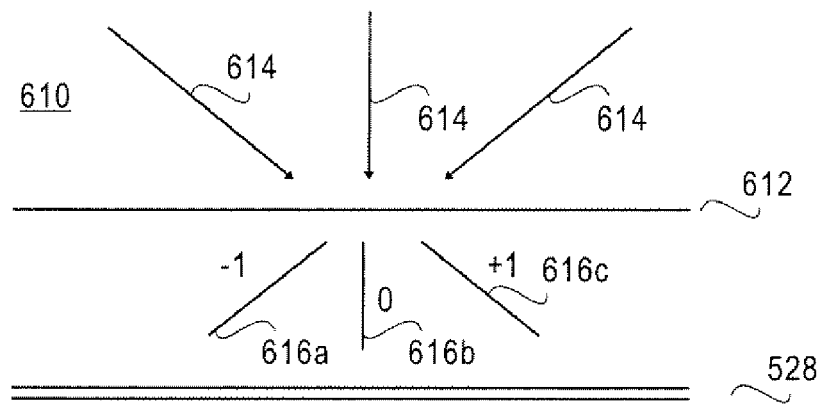
Figure 6C:
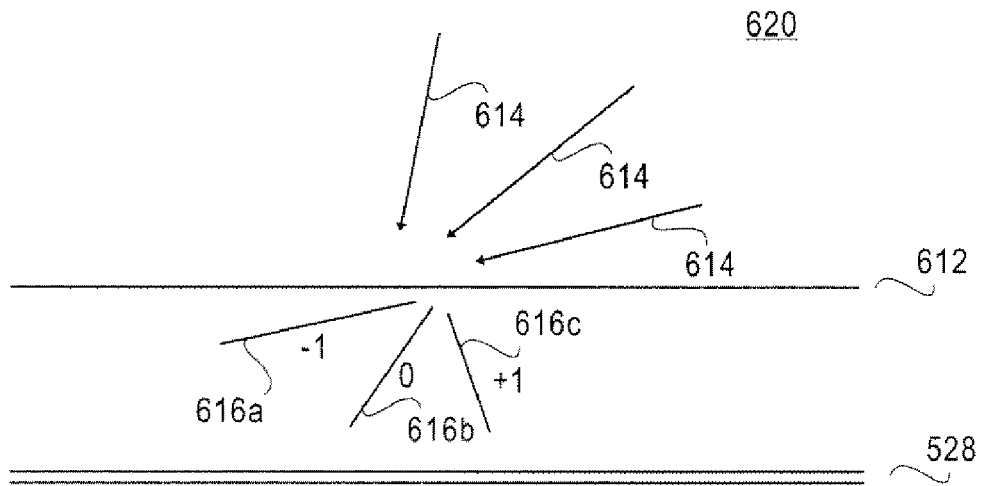

In one embodiment, the resist 528 may be patterned using an off-axis printing scheme. FIGS. 6A-C illustrate imaging the resist layer 528 using an off-axis illumination scheme. The resist layer 528 can be printed using many different techniques. The simplest technique involves shining a single UV light source through the mask to print the uncovered areas of the resist 528. However, a dipole light source may provide better results. FIG. 6A illustrates a dipole light source head 600. The head 600 includes two separate light sources 602 and 604. The light sources 602 and 604 can diffract when shone through a mask, and the diffracted light can interfere, providing very sharp imaging.

FIG. 6B illustrates a standard illumination scheme. The standard illumination scheme 610 is realized by shining a light, such as a circular single aperture opening at normal incidence directly over the mask 612. Rays of light 614 are directed through the mask 612, and diffract through the openings in the mask 612. Using an embodiment of the invention, the openings in the mask would be long one-dimensional slots. The diffracted light 616 is imaged onto the resist 528. As shown, three different orders of diffracted light, the −1 order 616a, the 0 order 616b, and the +1 order 616c are shown directed onto the resist 528. These three orders can create undesirable interference patterns. Instead, an off-axis technique can be used to improve imaging.

FIG. 6C illustrates an off-axis printing technique. Off-axis printing directs the light 614 through the mask 612 at an angle rather than from directly above. As can be seen, the −1 order 616a will not reach the resist 528 since the angle of the order 616a is too great. This leaves the 0 616b and +1 616c orders to interfere and interact to provide a sharp image. It is understood that these imaging techniques may be used for any of the photolithographic processes mentioned in this disclosure. It is also understood that it is not necessary to use an off-axis printing scheme, and that in some embodiments it may be necessary to use direct printing or other printing techniques depending on the requirements of the specific application.

In block 430, the ILD 526 is etched. FIG. 5N illustrates an etched ILD 526. The ILD 526 may be etched by a suitably selective dry etch chemistry. The etch condition is chosen so that the spacers 522 and the NESL 514 etch at a slower rate than the ILD 526, and thus the unwanted portions of the ILD 526 can be removed without affecting the gate stacks 518. Also, the resist layer 528 prevents the etchant from etching the portion of the ILD 526 that is not covering the gate stacks 518.

In block 432, a conductive material is deposited in the trench created by the etching in block 430. A conductive plug, comprising a material such as tungsten may be deposited in the opening 530. FIG. 5O illustrates a deposited conductive plug forming a bit line 532. The bit line 532 may be a plug which may be deposited using CVD or other appropriate deposition techniques. After deposition, the bit line 532 may be planarized and polished using CMP, etc. to provide a smooth surface on which other layers may be deposited. The bit line 532*a* performs the same functions as the prior contacts and the bit line did, but the bit line 532*a* is formed in a single step, and the opening 530 in the ILD 526 can be formed with a smaller feature size using currently available imaging techniques since the slot is imaged in one dimension rather than two. The bit line 532*a* makes contact with the drain regions 524. Working in conjunction with a word line that connects the control gate portion of the gate stacks 518, the flash memory cell array 500 can access any desired cell.

Figure 5P:
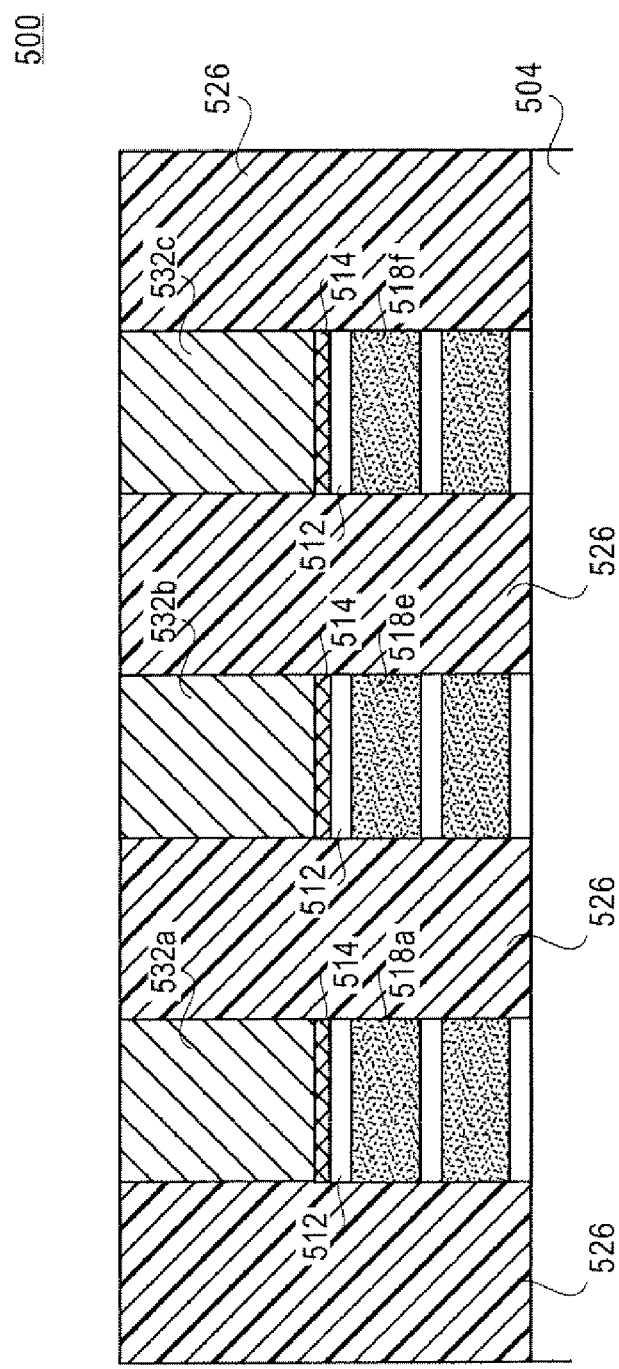

FIG. 5P illustrates a cross-sectional view of a bit line formed on a flash memory array. The bit lines 532*a*, 532*b*, and 532*c* correspond to the bit lines 302*a, b,* and *c* in FIG. 3A. FIG. 5P is a view corresponding to the line C 316 in FIG. 3A. As can be seen, a sufficiently thick bit line 532 has been formed. As can also be seen, the top of the ILD 526 can dictate the height of the bit lines 532. For example, when polishing the deposited metal, it can be polished back to the top of the ILD 526. This will isolate the bit lines from each other, allowing them to function independently.

Figure 5R:
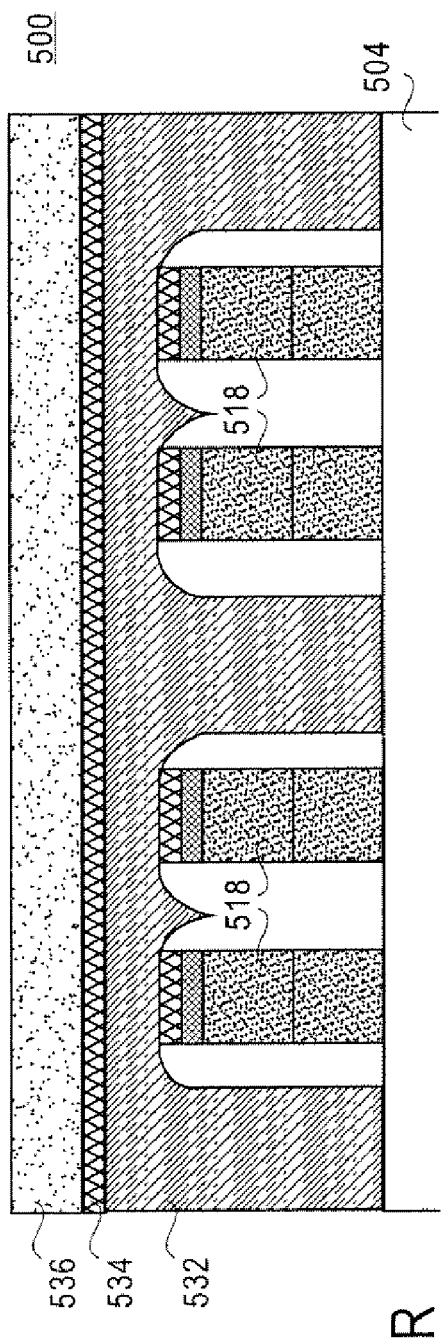
Figure 5S:
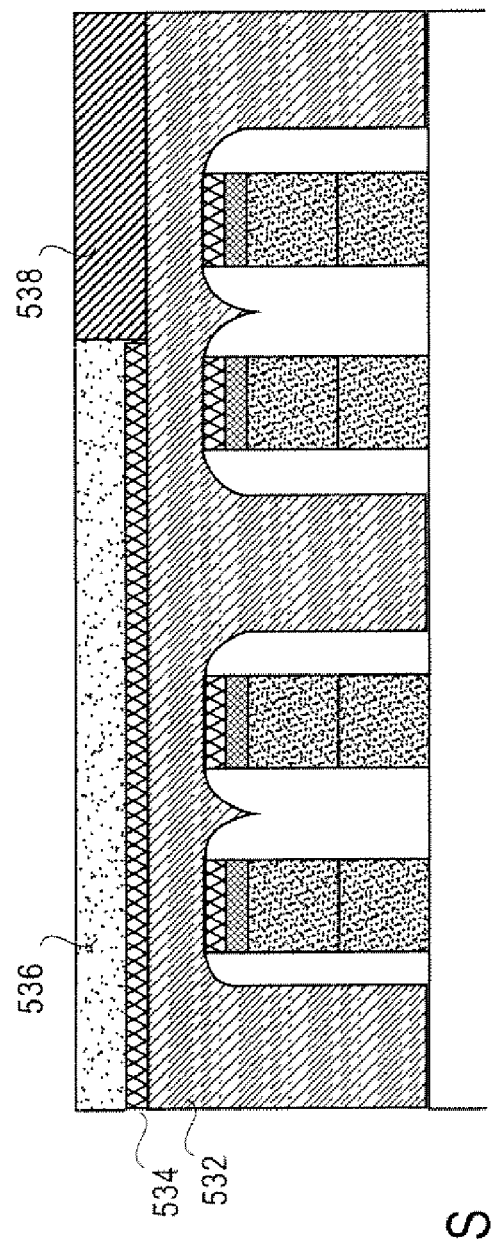

In block 434, a nitride etch stop layer (NESL) is deposited over the bit line 532. FIG. 5Q illustrates an NESL 534. The NESL 534 is used to protect the bit line 532 when an ILD deposited above the NESL 534 is etched. In block 436, a second ILD 534 is deposited over the NESL 534. FIG. 5R illustrates a second ILD 536. As mentioned above, the ILD 536 may be SiO$_2$ or any other appropriate dielectric that can be deposited using common semiconductor processing techniques. The second ILD 534 may also be planarized using CMP, etc.

In block 438, the second ILD 536 is etched, and a metal layer 538 is deposited on the cell array 500. FIG. 5S illustrates the metal layer 538. The metal layer 538 is used to provide external electrical communication with the bit line 532, and thus the drain regions 524 and the memory cells in the array 500. The metal layer 538 can be deposited using a photolithography and etch process to remove a portion of the second ILD 536, similar to the processes described above. The metal layer 538 may be copper, aluminum, etc, and may be deposited using known techniques such as CVD, PVD, etc.

In block 440, a metal damascene is formed above the cell array 500. The metal damascene can provide a series of interconnects to connect with the metal layer 538. The metal damascene allows the cell array 500 to be connected with outside devices, such as other circuitry. The damascene process generally involves depositing ILDs, removing portions of the ILDs to form openings, and depositing conductive materials in the openings to create a series of interconnects and vias.

It is understood that although the specific embodiments of the invention as described herein relate to a flash memory cell array, these embodiments may also be used on other semiconductor structures. For example, other memories, such a dynamic random access memories (DRAM) have similar structures and may benefit from such techniques. Further, although bit lines and drain regions are primarily discussed, it is understood that these techniques may be used over an entire array, including source straps and source regions.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A flash memory cell comprising:
   a plurality of gate stacks formed on a substrate, and a plurality of active regions formed in the substrate, wherein each of the plurality of the gate stacks has a gate stack length and a gate stack width;
   an interlayer dielectric (ILD) deposited over the gate stacks and the active regions;
   a single continuous one-dimensional slot patterned in the ILD that exposes the plurality of the gate stacks, wherein the one dimensional slot is to provide access to the plurality of active regions to form a bit line;
   to contact the plurality of active regions through the single continuous one-dimensional slot, wherein the single continuous one-dimensional slot has a length along the length of the bit line that is substantially larger than a width that is the gate stack width.

2. The flash memory cell of claim 1, wherein the bit line comprises a tungsten plug.

3. The flash memory cell of claim 1, wherein the flash memory cell is a NOR memory cell.

4. The flash memory cell of claim 1, further comprising: a plurality of nitride spacers adjacent to the gate stacks.

5. The flash memory cell of claim 1, wherein the gate stacks comprise a control gate and a floating gate.

6. The flash memory cell of claim 5, further comprising a word line to control the control gate.

7. A nonvolatile memory device comprising:
   a plurality of gate stacks formed on a substrate, wherein an etch stop layer forms a top surface of each gate stack within the plurality;
   a plurality of active regions formed in the substrate;
   an interlayer dielectric (ILD) deposited on the plurality of gate stacks and on the plurality of active regions;
   a single continuous one-dimensional slot patterned in the ILD that exposes the plurality of the gate stacks providing access to the plurality of active regions; and
   a bit line formed in the slot, the bit line in contact with the top surface of the gate stacks and in contact with the plurality of active regions, wherein the single continuous one-dimensional slot has a length along the length of the bit line that is substantially larger than a width that is a gate stack width.

8. The nonvolatile memory device of claim 7, wherein the bit line comprises a tungsten plug.

9. The nonvolatile memory device of claim 7, wherein the gate stack has at least one silicide layer.

10. The nonvolatile memory device of claim 7, wherein the etch stop layer is a dielectric material.

11. The nonvolatile memory device of claim 10, wherein the dielectric material is a nitride.

12. The nonvolatile memory device of claim 7, wherein the etch stop layer is on a silicide layer.

13. The nonvolatile memory device of claim 7, wherein a nitride spacer is adjacent to each of the plurality of gate stacks.

14. A nonvolatile memory device comprising:
   a plurality of gate stacks formed on a substrate, wherein each gate stack within the plurality comprises an etch stop layer;
   a plurality of active regions formed in the substrate;

an interlayer dielectric (ILD) on the plurality of active regions and on and adjacent to each gate stack of the plurality of gate stacks and;
a single continuous one-dimensional slot patterned in the ILS that exposes the plurality of the gate stacks, wherein the single continuous one dimensional slot is to provide access to the plurality of active regions;
a bit line formed in the single continuous one-dimensional slot, the bit line in contact with the etch stop layer of the plurality of gate stacks and in contact with the plurality of active regions.

15. The nonvolatile memory device of claim 14, wherein the bit line comprises a tungsten plug.

16. The nonvolatile memory device of claim 14, wherein the gate stack has at least one silicide layer.

17. The nonvolatile memory device of claim 14, wherein the etch stop layer is a dielectric material.

18. The nonvolatile memory device of claim 17, wherein the dielectric material is a nitride.

19. The nonvolatile memory device of claim 14, wherein the etch stop layer is on a silicide layer.

20. The nonvolatile memory device of claim 14, wherein a nitride spacer is adjacent to each of the plurality of gate stacks.

* * * * *